United States Patent [19]

Zachman et al.

[11] Patent Number: 5,111,406
[45] Date of Patent: May 5, 1992

[54] METHOD FOR DETERMINING DRILL TARGET LOCATIONS IN A MULTILAYER BOARD PANEL

[75] Inventors: Julie C. Zachman; Robert A. Kuntz, both of Madison; Steven R. Smith, Verona, all of Wis.; James S. Hudzik, Billerica, Mass.

[73] Assignee: Nicolet Instrument Corporation, Madison, Wis.

[21] Appl. No.: 462,393

[22] Filed: Jan. 5, 1990

[51] Int. Cl.$^5$ .............................................. G06F 15/46
[52] U.S. Cl. ........................... 364/474.02; 364/474.35; 382/49; 408/16
[58] Field of Search ....................... 364/474.02, 474.35, 364/474.36, 491, 474.18; 382/8, 30, 49; 408/1 R, 3, 16; 358/101; 356/237, 239

[56] References Cited

U.S. PATENT DOCUMENTS

| | | | |
|---|---|---|---|
| 3,573,455 | 4/1971 | Suierveld | 378/162 |
| 4,481,533 | 1/1984 | Alzmann et al. | 358/101 |
| 4,536,239 | 8/1985 | Benson | 156/64 |
| 4,668,982 | 5/1987 | Tinnerino | 382/8 |
| 4,720,798 | 1/1988 | Reed et al. | 364/489 |
| 4,790,694 | 12/1986 | Wilent et al. | 408/1 R |
| 4,829,375 | 5/1989 | Alzmann et al. | 358/101 |
| 4,898,636 | 2/1990 | Rigling | 156/626 |

OTHER PUBLICATIONS

PA-120 Operations Manual, Nicolet Instrument Corporation, release date Jul. 17, 1989.
K. Bieneman, "Drill Position Optimization Techniques Using Real-time X-ray Imaging", Nicolet Instrument Corporation, presented at the Printed Circuit Fabrication Exposition, Minneapolis, MN Sep. 15, 1987.
K. Bieneman, "Drill Position Optimization for MLB Process Control", PC FAB, Mar. 1988, pp. 45-50. This is a later version of the above-listed paper presented at the Printed Circuit Fabrication Exposition.
"MU 90 S: Controle des Circuits Imprimes", *Usine Nouvell*, issue #16, Apr. 21, 1988.
E. R. Davies, "Circularity—A New Principle Underlying the Design of Accurate Edge Orientation Operators", *Image and Vision Computing*, vol. 2, No. 3, pp. 134–142.
E. R. Davies, "A Modified Hough Scheme for General Circle Location", *Pattern Recognition Letters*, vol. 7, pp. 37–43 (1988).

*Primary Examiner*—Jerry Smith
*Assistant Examiner*—Paul Gordon
*Attorney, Agent, or Firm*—Foley & Lardner

[57] ABSTRACT

In order to correct for misregistration of solder pads in multilayer board (MLB) panels and determine drill target locations through vertical stacks of the solder pads, a fixture is prepared with fixture holes arranged in a pattern that corresponds with the locations of fiducial pads that are located on the MLB panel. The fixture has tooling pins that engage with tooling holes in the MLB panel to hold the MLB panel in an absolute position relative to the fixture. An x-ray inspection system views the superimposed image of a selected fixture hole and a corresponding fiducial pad that is visible within the boundary of the fixture hole. A software routine is then used to compute the offset between the fixture hole and the fiducial pad. The process is then repeated for the remaining sample of fixture holes and fiducial pads. The results are then fitted and then sent to a drilling machine to determine a position for the drilled holes in the MLB panel that compensates for the misregistration of the solder pads.

7 Claims, 5 Drawing Sheets

METHOD FOR DETERMINING DRILL TARGET LOCATIONS IN A MULTILAYER BOARD PANEL

FIELD OF THE INVENTION

This invention relates to a method for determining the locations of holes drilled through stacks of overlapping solder pads in a multilayer board panel.

BACKGROUND OF THE INVENTION

Multilayer board panels or production pieces are formed by laminating a plurality of individual layers of board panels together. Each multilayer board (MLB) panel has an electrically non-conductive substrate material having conductive patterns formed thereon to provide electrical interconnect paths. Such paths lead to conductor terminations known as solder pads. In order to provide electrical connections between the different board layers, through-holes are drilled through a vertical stack of solder pads in the different board layers and are plated with an electrically conductive material such as solder. Ideally, all solder pads of a vertical stack should be vertically aligned so that it is possible to drill through the center of each pad in the stack.

While the individual circuit boards may be formed very precisely, distortions introduced during the lamination processing result in a misregistration of the different MLB panel layers such that the solder pads from the different layers may not be in perfect vertical alignment. The relative misregistration of one layer to another reduces the area that the pads overlap, making the effective drill target smaller. The minimum radius of the effective drill target must be greater than the drill placement tolerance or drill breakout will occur. Drill breakout occurs when a drill hole is not completely contained within solder pads on all layers of an MLB panel and is normally considered a rejectable board defect.

In order to determine the drill targets to compensate for the misregistration of the different layers, a drilling template has been used to locate the position of the holes. The drilling template is a metal plate that is drilled with a pattern of holes or fiducial shapes that correspond to the locations of fiducial pads on the MLB panel. Fiducial pads are pads that are located on the MLB panel for inspection purposes but do not form a part of the electrical connections and are not drilled. The template is positioned on an x-y table of an automatic x-ray inspection system in the same position as will later be taken by the MLB panel. The x-y table is then moved and the position of all of the template holes or fiducial shapes are recorded relative to some fixed reference point within a computer memory. After the positions of the holes or fiducial shapes are recorded, the template is removed and an MLB panel is placed on the x-y table of the x-ray inspection system. The x-ray inspection system then records the positions of the fiducial pads on the MLB panel, again relative to the fixed reference. By comparing the positions of the holes or fiducial shapes in the template with the positions of the fiducial pads on the MLB panel, the offset between them may be calculated. This offset can then be used by a drilling machine to determine the correct position for the drilled holes through the vertical stacks of solder pads in the MLB panel.

One significant disadvantage of this approach is that the absolute position of both the template and the MLB panel must be known. This is because the template holes or fiducial shapes are recorded separately from the fiducial pads of the MLB panel. Since absolute position must be known, the motion of the x-y table of the inspection system must be repeatable to a very high degree of accuracy. Repeatable tables are expensive and are difficult and costly to maintain. The problem has been exacerbated as surface mount devices are increasingly employed and board dimensions continue to shrink. As the spacing between interconnected wires becomes smaller, the demand for accuracy in the repeatable x-y table continues to increase, leading to ever greater cost.

SUMMARY OF THE INVENTION

In accordance with the present invention, a metal plate referred to herein as a fixture, is prepared with fixture holes arranged in a pattern that corresponds with the locations of fiducial pads that are located on the MLB panel. Unlike the template, which is removed from the x-y table after the positions of the holes or fiducials have been recorded, the fixture remains on the x-y table while the MLB panel is being inspected. The fixture has tooling pins that engage with tooling holes in the MLB panel to mount the MLB panel upon the fixture. Engagement of the tooling pins and tooling holes holds the MLB panel in an absolute position relative to the fixture.

The x-ray inspection system views the superimposed image of a selected fixture hole and the corresponding fiducial pad of one of the layers in a field of view. The fiducial pad is thus visible within the boundary of the fixture hole. A software routine is then used to compute the offset between the fixture hole and fiducial pad, such as by first thresholding the image to separate the outline of the fixture hole from the outline of the fiducial pad and then computing the centroid of the separate images. The process is then repeated for the remaining sample of fixture holes and corresponding fiducial pads. The sample of offset coordinates that is obtained is then compared to the blueprint, or ideal location coordinates of the fiducial pads. The numbers are then fitted and the results sent to a drilling machine to determine a position for the drilled holes in the MLB panel that compensates for the misregistration of the solder pads.

The present invention does not require repeatability of the x-y table in that the engagement of the tooling pins and holes holds the MLB panel in an absolute position relative to the fixture and offset of the fiducial pads is measured in a single trip to each fixture hole where offset measurements are being taken. Thus, the present invention realizes savings in the cost of repeatable tables and increased accuracy due to the fact that the machine will be as accurate as the fixture construction, placement, and tooling, all of which are one-time occurrences.

Further objects, features, and advantages of the invention will be apparent from the following detailed description taken in conjunction with the accompanying drawings.

DESCRIPTION OF THE PREFERRED EMBODIMENT

Figure 1:
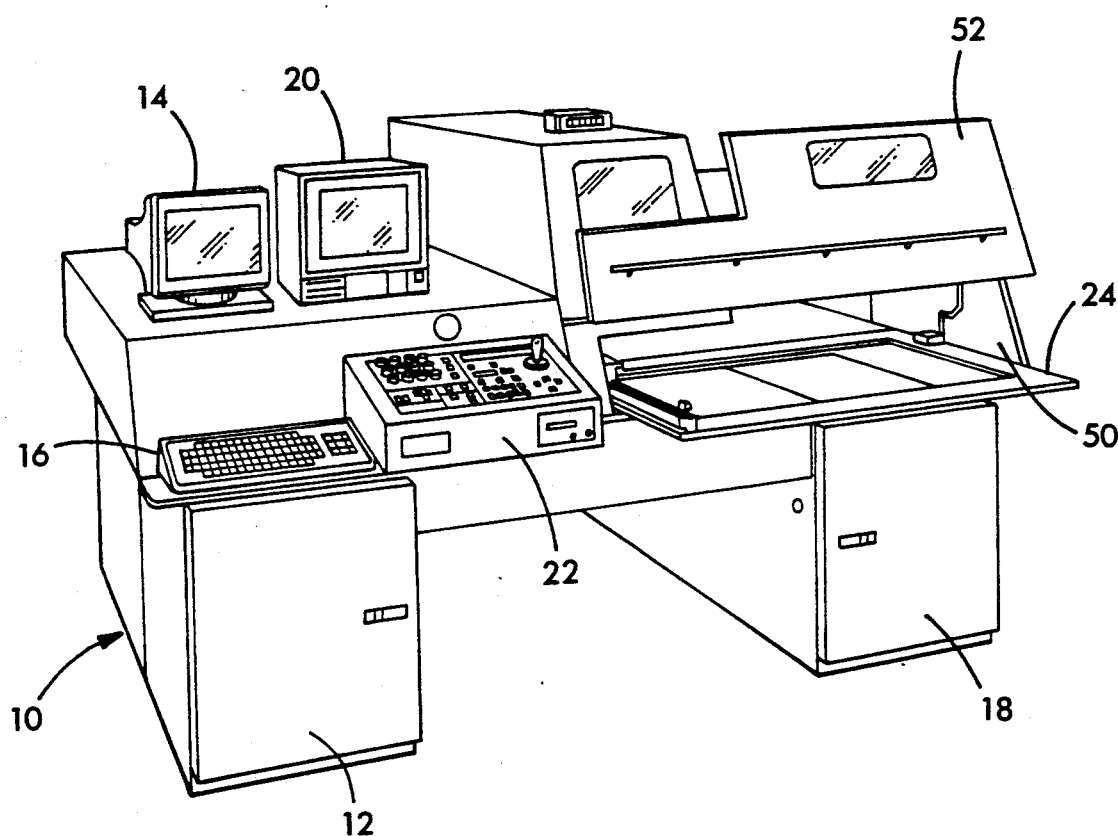
FIG. 1 is a perspective view of an x ray inspection system that may be used in accordance with the present invention.

With reference to the drawings, an x-ray inspection system suitable for use in the method of the present invention is shown at 10 in FIG. 1. The x-ray inspection system 10 comprises a computer 12, a computer display 14, a computer keyboard 16, an image processing unit 18, an image display 20, a control panel 22, and a sample tray 24. The computer 12 is programmed to "learn" a fixture and "inspect" an MLB panel according to the steps that are more fully explained below. The computer display 14 is used to view various menus that the user uses during operation of the system 10, and various prompts also appear on the display 14. The keyboard 16 is used to move the user through the various menus and enter parameter values that the system 10 uses to "learn" all of the information it will require to automatically inspect MLB panels. The image processing unit 18 records an x-ray image of an MLB panel positioned upon the sample tray 24. The image display 20 displays the MLB panel that is being inspected and is used further to help "teach" the system 10 what it needs to "learn" about each MLB panel for later inspection. The control panel 22 provides the basic controls to manipulate the system 10, including displays and readouts, a joystick to position the sample tray 24, x-ray controls, and camera motion controls.

Figure 2:
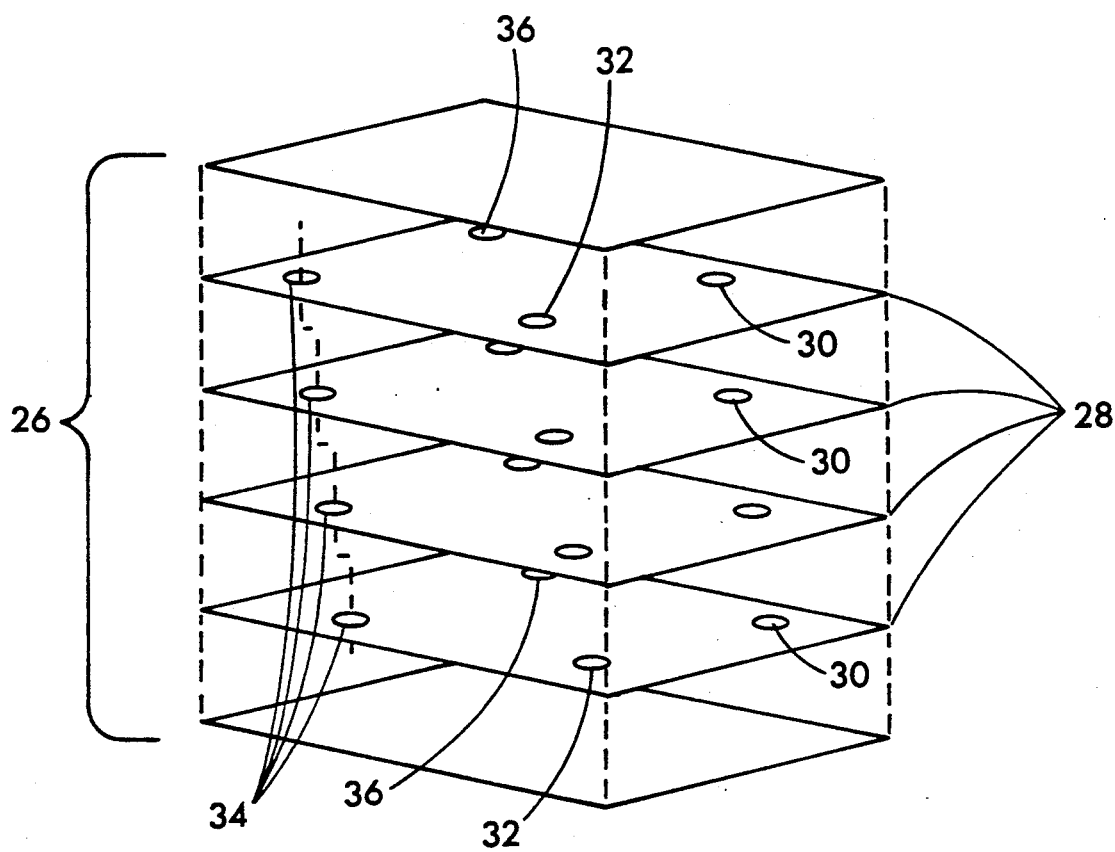
FIG. 2 is an exploded side view of an exemplary MLB panel, each of the individual layers being spaced apart for illustration purposes.
Figure 3:
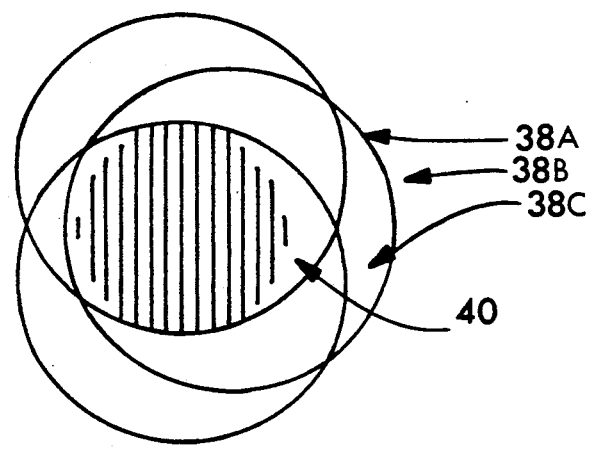
FIG. 3 is an exemplary projection view of the overlapping solder pads in a vertical stack.

FIG. 2 shows an exploded view of an exemplary MLB panel 26 having a plurality of layers 28, each of the layers 28 being spaced apart for illustration purposes. Electrical paths on the individual layers 28 terminate in solder pads 30, 32, 34 and 36. The solder pads 30, 32, 34, and 36 from the respective layers 28 are arranged in vertical stacks in order that electrical connections may be made between the different layers. Such connections are formed by drilling holes through the vertically arranged pads 30, 32, 34, 36 and then plating the holes with an electrically conductive material such as solder. The actual number of holes that are drilled through sets of vertically arranged solder pads for a particular panel may be in the hundreds or thousands. The number and size of the layers 28 will vary depending upon the end use, as will the number and location of the solder pads 30, 32, 34, and 36. It is further to be understood that the size of the solder pads 30, 32, 34, and 36 are exaggerated herein for illustration purposes. In the herein specification, the layers 28 are designated as being in an x-y plane and the pads 30, 32, 34, or 36 are stacked in a z-axis. Due to the steps in the lamination process, stacks of vertically adjacent solder pads 30, 32, 34, or 36 may be misregistered from one another. Such misregistration of pads is shown in FIG. 3, which shows an enlarged projection view of overlapping pads 38A, 38B, and 38C of a vertical stack from a three-layer circuit board. As shown in FIG. 3, there is an effective drill target 40 (shown cross-hatched) that represents the common overlapping area of the pads 38A, 38B, and 38C. The hole that is to be drilled through the pads 38A, 38B, and 38C must be drilled within the effective drill target 40 in order to provide the proper electrical connection. The MLB panel 26 is built according to a "blueprint". If the solder pads 38A, 38B, and 38C could be built exactly according to the blueprint, there would be no misregistration of the layers 28 and the solder pads 38A, 38B, and 38C would be in perfect vertical alignment at the locations as specified by the blueprint, referred to herein as the blueprint coordinates of the solder pads. Further, if there was no misregistration of the layers 28, then the ideal drill coordinates would be the same as the blueprint coordinates of the solder pads.

Figure 4:
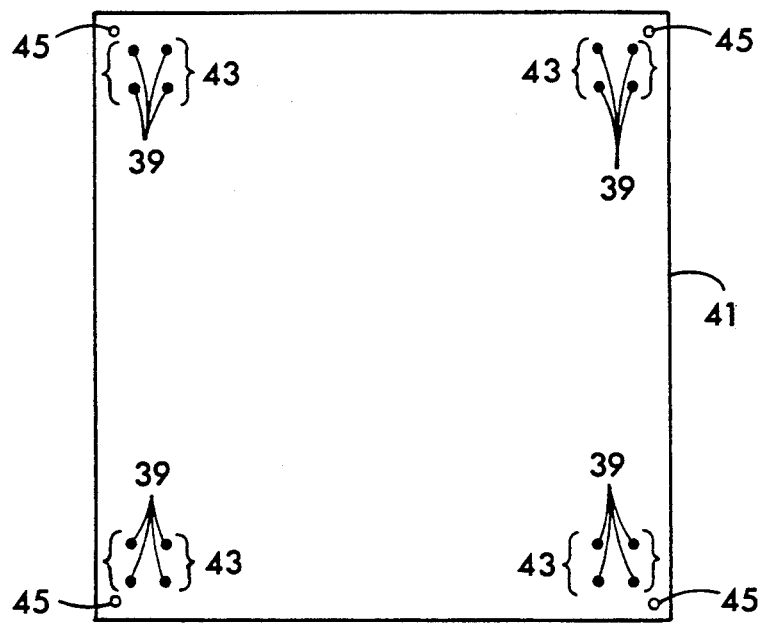
FIG. 4 is a view in the x-y plane of an exemplary MLB panel.

In addition to solder pads used to make electrical connections between the layers of the MLB panel, each MLB panel also has fiducial pads 39 at various locations on the MLB panel, as highlighted in a panel 41 in FIG. 4. Fiducial pads 39 are located as reference points on the panel 41 and are staggered so that there is no overlap of fiducial pads 39 from one layer to another. The fiducial pads 39 are grouped closely together in arrangements known as coupons 43 such that there is one fiducial pad 39 from each of the different layers in close proximity without overlapping. Using the panel 41 of FIG. 4 as an example, the panel 41 has four layers. The panel 41 has four coupons 43 positioned near each of the corners of the panel 31. Each of the coupons 43 has four fiducial pads 39, each pad 39 being located on a different layer. The fiducial pads 39 of a particular coupon are therefore configured in a pattern in order that each layer may be uniquely identified. The panel 41 also has tooling holes 45 located in each of the corners of the panel 41. It is to be understood that the size of the fiducial pads 39 is exaggerated herein for illustration purposes. It is to be also understood that the depiction of FIG. 3 is meant to highlight the fiducial pads 39 and the tooling holes 45, though there would also be solder pads across the x-y face of the panel 41 that are to be drilled to provide electrical connections. The fiducial pads 39 are also built to be located according to blueprint coordinates, though the fiducial pads 39 are subject to misregistration in the same manner as the solder pads 38A, 38B, and 38C.

Figure 5:
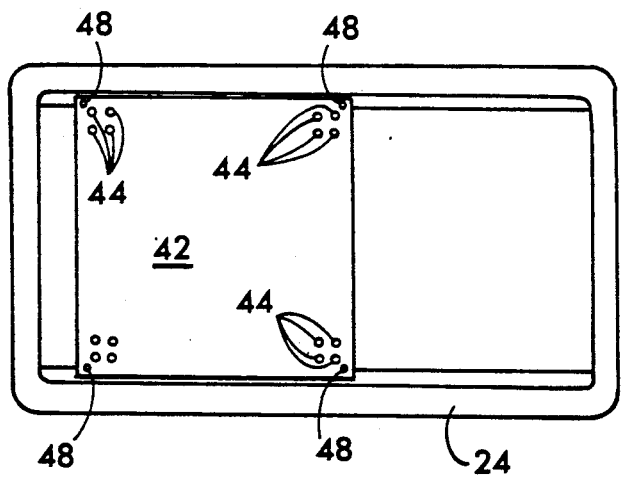
FIG. 5 is a top view of an exemplary fixture as secured to the sample tray.

In the method of the present invention, a fixture 42 is carefully prepared with fixture holes 44 that correspond to the x-y blueprint locations of the fiducial pads 39 of the panel 41. The fixture 42 is shown in FIG. 5. In FIG. 5, the top of the fixture 42 is shown as it is positioned and secured on the sample tray 24 of the system 10. The sample tray 24 is mounted upon a table (not shown) and movable in x and y directions by motors (not shown). Movement of the sample tray 24 is necessary to examine different fields of view of the MLB panel. The fixture 42 has tooling pins 48 in each of the corners of the fixture 42 that engage with the tooling holes 45 of the MLB panel 41 in which the drill target locations are to be determined. The engagement of the tooling pins 48 with the tooling holes 45 allows the MLB panel to be held rigidly in an absolute position relative to the fixture 42.

Figure 6:
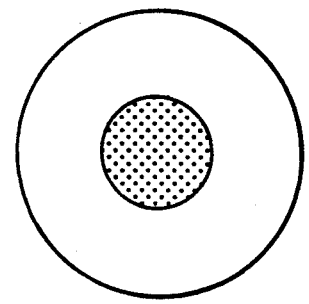
FIG. 6 is an exemplary field of view x-ray image visible in the, image display showing a fixture hole and the corresponding fiducial pad.

After the fixture 42 is secured to the sample tray 24, and the MLB panel in which the drill target locations are to be determined is mounted thereon, the sample tray 24 is slid within a chamber 50 for x-ray inspection, shown in FIG. 1. FIG. 1 shows a door 52 to the chamber 50 in an open position and the sample tray 24 slid outward for access to the operator. During x-ray inspection, the sample tray 24 is slid within the chamber 50 and the door 52 is in a closed position. A camera (not shown) is contained within the chamber 50. When the MLB panel 41 is mounted upon the fixture 44, the sample tray 24 is contained within the chamber 50, and the door 52 is closed, an x-ray image of a particular fixture hole 44 and the fiducial pad 39 may be viewed at the image display 20. FIG. 6 shows a typical field of view containing one of the fixture holes 44 and fiducial pads 39 as would be seen at the image display 20. The fixture holes 44 of the fixture 42 are larger than the fiducial pads 39 of the MLB panel 41. Thus, each of the fiducial pads 39 are contained within the boundaries of a respective fixture hole 44. A software routine of the computer 12 then computes the offset between the fixture hole 44 and the fiducial pad 39 visible in the field of view, such as by first thresholding the image to separate the outline of the respective fixture hole 44 from the fiducial pad 39, and then computing the centroid of the separate images. The offset information is then sent to a drilling machine which drills the vertical stacks of the solder pads of the MLB panel in accordance with the offset.

Figure 7:
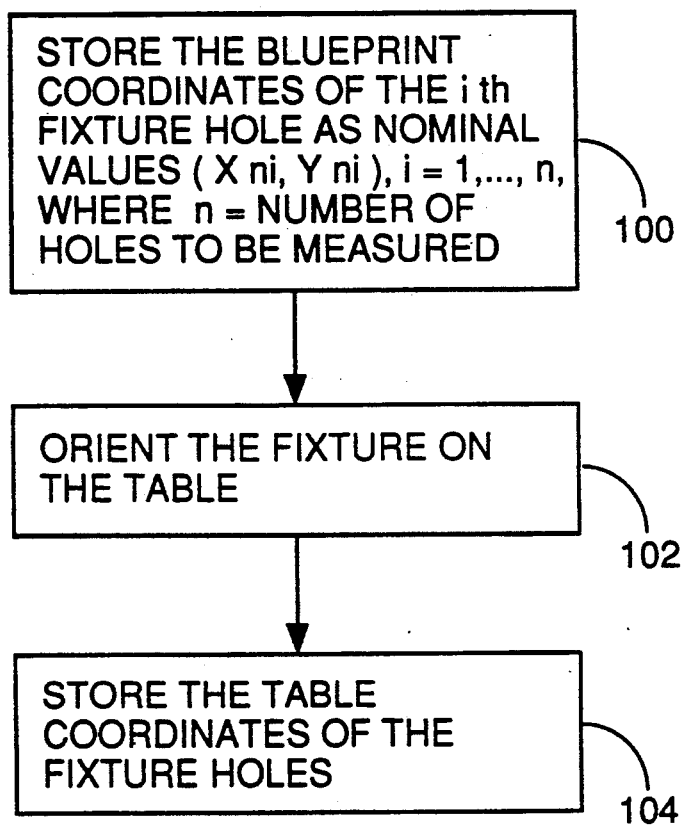
FIG. 7 is a block diagram of the learn sequence in the method of the present invention.
Figure 8:
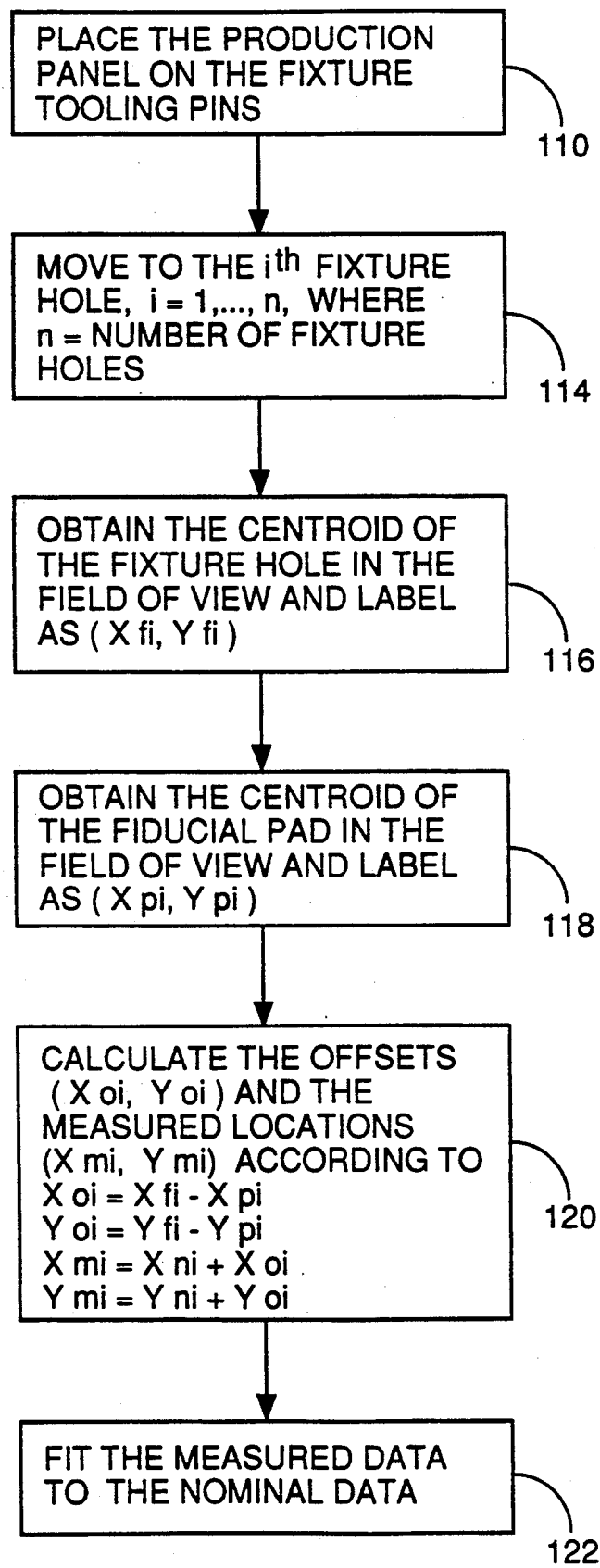
FIG. 8 is a block diagram of the inspect sequence in the method of the present invention.

The steps in determining the location of the holes to be drilled within the pads 42 are outlined in the block diagrams of FIGS. 7 and 8. FIG. 7 may be considered a "learn" sequence and FIG. 8 may be considered an "inspect" sequence. In the first step of the learn sequence, the ideal, or blueprint, coordinates relative to a fixed reference point for each of the fixture holes 44 of the fixture 42 are entered and stored within the computer 12 at 100. The blueprint coordinates of the fixture holes 44 and the blueprint coordinates of the fiducial pads 39 would be the same inasmuch as they are correspondent points. After orienting the fixture 42 upon the sample tray 24 at 102, the table coordinates of the fixture holes 42 are entered into the computer 12 at 104. The inspect sequence follows and begins by mounting of the MLB panel 41 upon the fixture 42 at 110 by engagement of the tooling pins 48 and the tooling holes 45, such as described above. Upon movement to a field of view as seen at the display 20 containing a first fixture hole 44 at 114, the centroid of the fixture hole 44 and the respective centroid of the fiducial pad 39 is obtained at 116 and 118. The ability to determine the centroids of either the fixture hole 44 or the fiducial pad 39 is known in the art and described in articles by E.R. Davies, "A Modified Hough Scheme for General Circle Location," Pattern Recognition Letters, vol. 7 (Jan., 1988), pp. 37–43 and "Circularity-A New Principle Underlying the Design of Accurate Edge Orientation Operators:" Image and Vision Computing, vol. 2, no. 3, pp. 34–142. The movement to the field of views of the first and subsequent patterns 44 is accomplished by the computer 12 recalling the table coordinates obtained at 104. The x-coordinate offset is obtained at 120 by subtracting the x-coordinate of the fiducial pad 39 from the x-coordinate of the fixture hole 44. The y-coordinate offset is further obtained at 120 by subtracting the y-coordinate of the fiducial pad 39 from the y-coordinate of the fixture hole 44. A "measured location" is then obtained at 120 by adding the x and y offsets to the ideal, or blueprint, coordinates that were stored by the computer 12 at 100. The steps 114, 116, 118, and 120 are then repeated for all of the fixture holes 44 and the associated fiducial pads 39 that may be viewed within. The offsets and measured locations that are thus obtained represent a sampling from each of the different layers from different locations across the x-y face of the MLB panel 41. The fiducial pads 39 are often from coupons 43 located in the four corners of the panel 41 because the four corners usually represent the "worst case" misregistration on the panel 41.

Having obtained a sample of the x-y coordinates of the measured locations of the fiducial pads 39 and the x-y coordinates of the ideal, or blueprint, locations of the fixture holes 44, the values may be analyzed by a Best Fit algorithm. The offsets are thus fitted to produce a single offset value that may be added to each of the ideal, or blueprint, coordinates of the solder pads to produce corrections to the ideal drill coordinates. By use of alternate Best Fit algorithms, it is possible to fit not only to x and y coordinates, but also to include corrections to rotational ( $\theta$ ) misregistration of the layers of the panel 41. For such a case, there are as many offset values as there drill coordinates.

Though the specification has referred to fiducial pads throughout, it is recognized that there may be other configurations that may be used as reference points in the manner that the fiducial pads are used herein. A "fiducial pad" is therefore broadly defined as any reference point or fiducial that may be used in the manner such as the fiducial pads specified herein.

It is further understood that the invention is not confined to the particular methods herein illustrated and described, but embraces such modified forms thereof as come within the scope of the following claims.

What is claimed is:

1. A method of determining locations for an x-y arrangement of holes to be drilled in a multilayer board panel in accordance with blueprint coordinates for solder pads and fiducial pads, each of the holes being drilled through a z-axis stack of overlapping solder pads, the panel being constructed to have ideal drill coordinates located at the blueprint coordinates of the solder pads and having fiducial pads according to additional blueprint coordinates located at staggered locations in each layer of the panel so that there is no overlap of fiducial pads from one layer to another, the method comprising the steps of:
   (a) preparing a fixture to have fixture holes that correspond with the blueprint coordinates of the fiducial pads of several layers of the multilayer board panel;
   (b) storing the blueprint coordinates of the fiducial pads;
   (c) mounting the panel upon the fixture in an absolute position relative to the fixture such that the fixture holes of the fixture and the fiducial pads of the panel are superimposed;
   (d) examining the fixture holes of the fixture and the fiducial pads of the multilayer board panel with a radiation source and detector;
   (e) computing an offset between the fixture holes and the fiducial pads by comparing the locations of the fixture holes and the correspondent fiducial pads of the panel that are superimposed on the fixture holes as seen by the detector;
   (f) calculating a correction to be made on the ideal drill coordinates using the computed offsets to provide corrected drill coordinates; and
   (g) drilling holes through the solder pads at the corrected drill coordinates.

2. The method of Claim 1 wherein the fixture is prepared by forming fixture holes that are larger than the fiducial pads of the multilayer board panel such that the image of the fiducial pads may be seen within images of the fixture holes when the fixture holes and the fiducial pads are examined with the radiation source and detector.

3. The method of Claim 1 wherein the multilayer board panel is mounted upon the fixture by engaging tooling pins of the fixture with tooling holes in the multilayer board panel.

4. The method of claim 1 wherein the fixture holes and the fiducial pads are examined by x-rays.

5. The method of claim 1 wherein the fixture holes and fiducial pads are circular, the fixture holes are larger than the fiducial pads, and the offsets between the fixture holes and the correspondent fiducial pads is calculated by determining the displacement between the centriod of the fixture hole of the fixture and the centroid of the respective fidcial pads of the multilayer board panel.

6. The method of claim 1 wherein the offsets are fitted to produce a single offset value that is added to each of the ideal drill coordinates.

7. The method of claim 1 wherein the offsets are fitted to include a rotational correction that is added to each of the ideal drill coordinates, the correction being variable for each of the drill coordinates.

* * * * *